(12) United States Patent
Ishiguri et al.

(10) Patent No.: US 6,462,415 B1
(45) Date of Patent: Oct. 8, 2002

(54) SEMICONDUCTOR DEVICE AS AN OBJECT OF THICKNESS REDUCTION

(75) Inventors: Masahiko Ishiguri, Kanagawa (JP); Eiji Watanabe, Kanagawa (JP); Yutaka Makino, Kanagawa (JP); Koichi Murata, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/594,155

(22) Filed: Jun. 15, 2000

(30) Foreign Application Priority Data

Jan. 11, 2000 (JP) ................................................ 002551

(51) Int. Cl.[7] .............................................. H01L 23/48
(52) U.S. Cl. ...................... 257/738; 438/612; 438/613; 438/614
(58) Field of Search ...................... 428/620; 438/612, 438/614, 613

(56) References Cited

U.S. PATENT DOCUMENTS 4,880,708 A * 11/1989 Sharma et al. .............. 428/620
5,108,950 A * 4/1992 Wakabayashi et al. ...... 438/613
5,298,459 A * 3/1994 Arikawa et al. ............. 438/612
5,310,699 A * 5/1994 Chikawa et al. ............ 438/614
5,773,359 A * 6/1998 Mitchell et al. ............. 438/614
5,885,891 A * 3/1999 Miyata et al. ............... 438/612
6,077,765 A * 6/2000 Naya ........................... 438/614

* cited by examiner

*Primary Examiner*—David Nelms
*Assistant Examiner*—Mai-Huong Tran
(74) *Attorney, Agent, or Firm*—Staas & Halsey LLP

(57) ABSTRACT

There is provided a semiconductor device which comprises electrode pads formed on an insulating film on a semiconductor substrate, an insulating cover film formed on the insulating film to have openings that expose the electrode pads, and a masking tape having a base material layer and a resist layer coated on the base material layer, and for covering an upper surface of the cover film and inner surfaces of the openings in a situation that the resist layer is directed toward a semiconductor substrate side. Accordingly, it is possible to improve a throughput in a series of steps of grinding/polishing the semiconductor substrate and forming the bump electrodes which are required to thin the substrate of the semiconductor device.

8 Claims, 19 Drawing Sheets

SEMICONDUCTOR DEVICE AS AN OBJECT OF THICKNESS REDUCTION

BACKGROUND OF THE INVENTION

1. Field of the Invention

The present invention relates to a semiconductor device and a method of manufacturing the same and, more particularly, a semiconductor device as an object of thickness reduction and a semiconductor device manufacturing method containing the step of polishing a back surface of a semiconductor substrate.

2. Description of the Prior Art

To reduce a thickness of a semiconductor integrated circuit (LSI) chip is important to the size reduction of the semiconductor device that is constructed by packaging an LSI chip, the three-dimensional packaging technology for stacking the semiconductor devices, etc.

Normally, the method of polishing a back surface of a semiconductor substrate, on which semiconductor elements are formed, is employed as the method of reducing the thickness of the LSI chip.

For example, as shown in FIGS. 1A to 1C, there is such a method that a masking tape 102 is stuck onto one surface of a semiconductor substrate 101, then the other surface (back surface) of the semiconductor substrate 101 is grinding/polished by a grinder 103 to reduce its thickness into a desired thickness, and then the masking tape 102 is peeled off. The masking tape 102 is provided to protect the elements formed on the semiconductor substrate 101 from the mechanical stress caused in grinding/polishing.

As the method of attaching the bump electrodes to the semiconductor substrate to be polished by such method, there are two methods described in the following.

First, as shown in FIG. 2A, in the situation that the masking tape 102 is stuck onto one surface of the semiconductor substrate 101, the other surface of the semiconductor substrate 101 is polished by the grinder 103 to reduce the thickness and then the masking tape 102 is removed from the semiconductor substrate 101. Then, as shown in FIG. 2B, bump electrodes 105 are formed on a pad 104 on one surface of the semiconductor substrate 101.

Second, as shown in FIG. 3, the bump electrodes 105 are formed the pad 104 formed on one surface of the semiconductor substrate 101, then the masking tape 102 is stuck onto one surface of the semiconductor substrate 101 to cover the bump electrodes 105, and then the other surface of the semiconductor substrate 101 is polished, as shown in FIG. 1B.

In this case, the bump electrodes 105 are formed by using resist that is formed after an operation for removing all the masking tape is finished.

Meanwhile, the masking tape employed in grinding/polishing the back surface of the semiconductor substrate is expensive. In addition, the disposal of the masking tape that is peeled off from the semiconductor substrate causes the environmental pollution.

Also, if the bump electrodes are formed on the semiconductor substrate after the grinding/polishing of the semiconductor substrate have been completed, the thinned of the semiconductor substrate is ready to crack in the middle of the formation of the bump electrodes to thus cause the deterioration of the yield.

In contrast, if the bump electrodes are formed on the semiconductor substrate, then the masking tape is stuck on the overall semiconductor substrate, and then the semiconductor substrate is ground/polished, sometimes the semiconductor substrate is cracked due to the stress concentration onto the bump electrodes.

In addition, as described above, there is another problem that a series of operations such as sticking of the masking tape, peeling-off of the masking tape, formation of the bump electrodes, etc. take a lot of times.

SUMMARY OF THE INVENTION

It is a first object of the present invention to provide a semiconductor device capable of improving throughput in a series of steps of grinding/polishing of the semiconductor substrate and formation of bump electrodes, and a method of manufacturing the same.

It is a first object of the present invention to provide a semiconductor device manufacturing method capable of preventing crack of the substrate upon grinding/polishing of the substrate on which bump electrodes are formed.

According to the present invention, one surface of the semiconductor substrate is covered with the masking tape that consists of the base material layer and the resist layer coated on this base material layer.

Therefore, if only the base material layer of the masking tape is stripped off after the polishing of the other surface (back surface) of the semiconductor substrate has been finished and then the remaining resist layer is used in patterning as it is, the step of coating the resist onto the semiconductor substrate can be omitted.

Also, according to the present invention, one surface of the semiconductor substrate is covered with the masking tape which consists of the base material layer and the resist layer coated on this base material layer, then the other surface (back surface) of the semiconductor substrate is polished, then the base material layer of the masking tape is stripped off from the masking tape.

Therefore, if the resist pattern used for the bump electrode formation and the wiring formation is formed by exposing/developing the resist layer as it is, time and labor for coating the resist can be omitted and thus the throughput can be improved.

Also, since it is ready to remove the resist layer almost perfectly by the solvent, the upper surface of the semiconductor substrate is never contaminated.

In addition, since the adhesive does not remain on the peeled base material layer unlike the prior art, the base material layer can be re-used and thus an amount of waste product can be reduced, whereby this manufacturing method is useful for the environmental protection.

Further, if the base material layer is formed of material that can block the exposure of the resist layer, the processes required until the peeling-off of the base material layer from the resist layer can be performed in the normal environment. Thus, the operability can be improved.

According to the present invention, prior to the polishing of the back surface of the semiconductor substrate, the flux or the resist is coated between the projection electrodes formed on the opposite side surface and then the masking tape is pasted thereon.

Therefore, in polishing the semiconductor substrate, the pushing force of the masking tape is applied to not only the projection electrodes but also the flux or the resist to scatter, and thus the crack of the semiconductor substrate can be prevented.

Also, in the event that the flux is formed between the projection electrodes, if the masking tape is pasted as it is after the projection electrodes covered with the flux are heated, the number of steps is never increased rather than the prior art.

In addition, in the event that the resist is coated between the projection electrodes, the resist can be cured by baking after the coating and thus the stress applied to the semiconductor substrate becomes uniform.

Further, if the masking tape is pasted on the flux or the resist, the adhesive layer of the masking tape does not remain on the substrate.

According to the present invention, the adhesive layer of the masking tape is projected in the area that corresponds to the peripheral area of the semiconductor substrate.

Therefore, the force applied from the masking tape to the projection electrodes is distributed to the peripheral portion of the semiconductor substrate, and thus the substrate becomes hard to crack.

In addition, a plurality of projection electrodes are formed uniformly in height by the pushing force of the masking tape. In this case, since a pushing level of the masking tape is limited by the projected adhesive layer on the peripheral area, there is no possibility that the height of the projection electrodes is excessively lowered.

According to the present invention, the other surface of the semiconductor substrate is polished in the situation that one surface of the semiconductor substrate is covered with the masking tape, then the masking tape is stripped off in the situation that the go support tape is pasted on the other surface, and then the projection electrodes are formed on one surface.

Therefore, since the semiconductor substrate is reinforced by the support tape, the substrate becomes hard to crack in forming the projection electrodes.

DETAILED DESCRIPTION OF THE PREFERRED EMBODIMENTS

Embodiments of the present invention will be explained with reference to the accompanying drawings hereinafter.

First Embodiment

FIGS. 4A to 4K are sectional views showing manufacturing steps of a semiconductor substrate according to a first embodiment of the present invention.

Figure 1A:
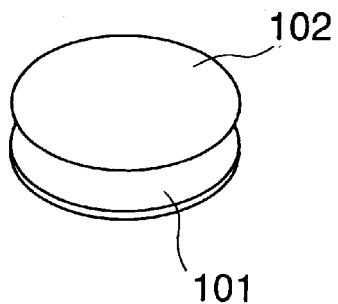
FIGS. 1A to 1C are perspective views showing a polishing method of a semiconductor substrate in the prior art.
Figure 1B:
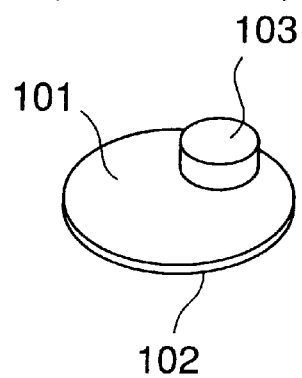
Figure 1C:
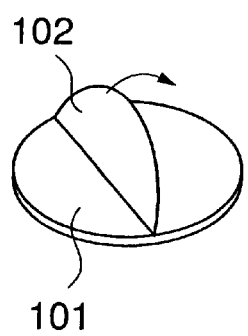
Figure 2A:
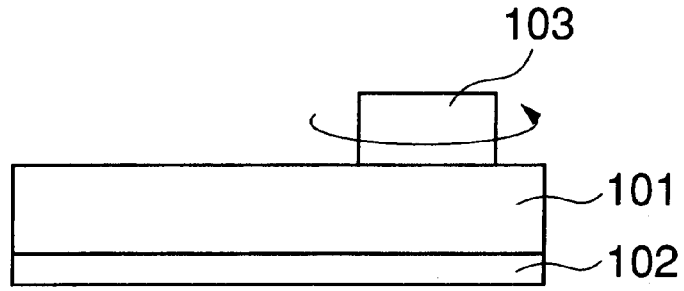
FIGS. 2A and 2B are sectional views showing a first method of forming bump electrodes of the semiconductor substrate in the prior art.
Figure 2B:
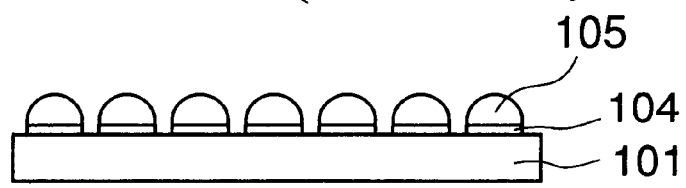
Figure 3:
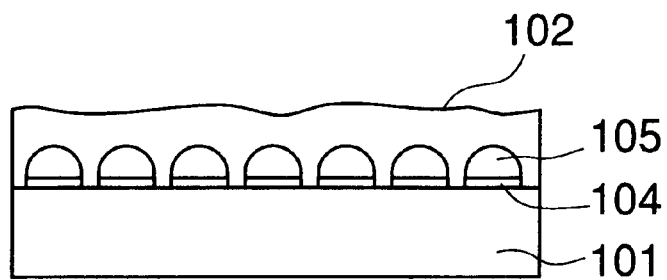
FIG. 3 is a sectional view showing a second method of forming the bump electrodes of the semiconductor substrate in the prior art.
Figure 4A:
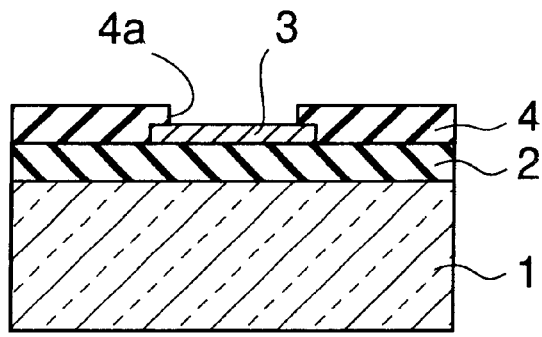
FIGS. 4A to 4K are sectional views showing grinding/polishing/steps of a semiconductor substrate according to a first embodiment of the present invention.

First, as shown in FIG. 4A, an insulating film 2 is formed on a silicon (semiconductor) substrate 1 on which semiconductor elements such as transistors (not shown) are formed, and then electrode pads 3 are formed thereon. The electrode pads 3, although omitted in FIG. 4A, are formed in plural on the insulating film 2.

The electrode pads 3 are electrically connected to the semiconductor elements formed on the silicon substrate 1. The insulating film 2 may be formed to insulate multilayered wirings mutually, or may be formed to cover the semiconductor elements in the silicon substrate 1.

In turn, an insulating cover film 4, e.g., silicon oxide film is formed on the insulating film 2 and the electrode pads 3. Then, an opening 4a to expose the electrode pads 3 is formed by patterning the cover film 4 by virtue of the photolithography method.

Figure 4B:
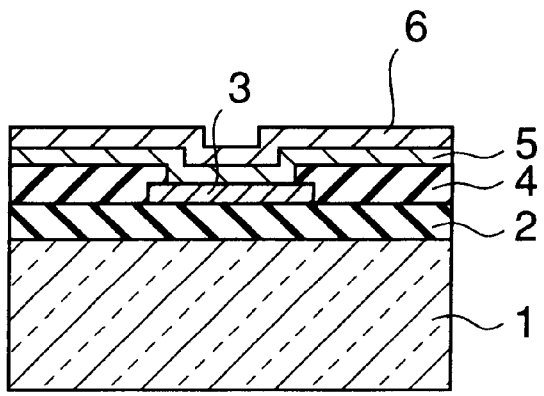

Then, as shown in FIG. 4B, a first metal film 5 made of titanium (Ti) is formed on the cover film 4 and in the opening 4a to have a thickness of 500 nm. Then, a second metal film 6 made of nickel (Ni) is formed on the first metal film 5 to have a thickness of 500 nm.

Figure 5:
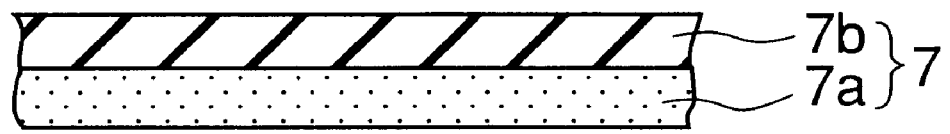
FIG. 5 is a sectional view showing a masking tape employed in the first embodiment of the present invention.

In turn, as shown in FIG. 5, a protection film is prepared that consists of a resist layer 7a having a thickness of 25 to 125 $\mu$m and a base material layer 7b coated on the resist layer 7a to have a thickness of 50 to 200 $\mu$m.

The resist layer 7a is composed of the cyclic rubber such as bisazide, azide compound, etc. as photosensitive material for g-line, i-line, ultraviolet rays, electron beams, etc. The resist layer 7a may be formed by either positive resist or negative resist. In the following example, the positive resist is employed. Also, the base material layer 7b is composed of the resin such as PET (polyethylene naphthalate), PP (polypropylene), etc. In this case, in order to prevent the exposure of the resist layer 7a, exposure-light shielding material may be contained in the base material layer 7b or may be coated on the resist layer 7a.

Figure 4C:
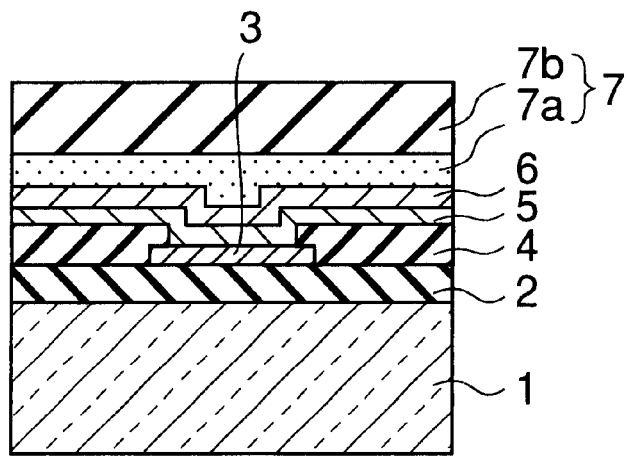

Then, as shown in FIG. 4C, the protection film 7 is stuck on the second metal film 6 by the pressure bonding.

Figure 4D:
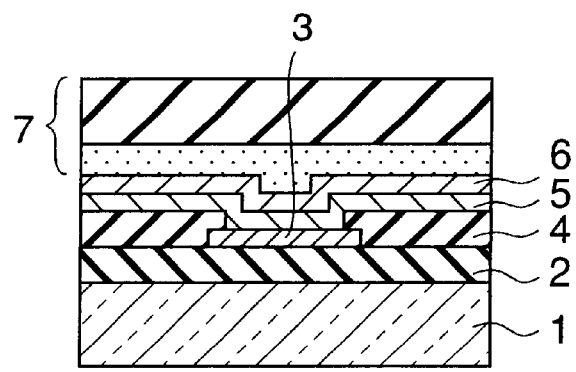
Figure 6:
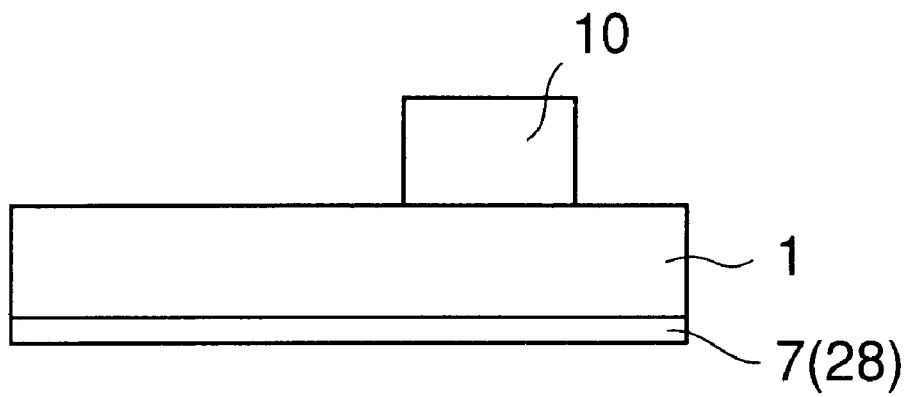
FIG. 6 is a view showing a polished state of a silicon substrate in the first embodiment of the present invention.

Then, as shown in FIG. 4D and FIG. 6, a back surface of the silicon substrate 1 is ground/polished by the back grinding method. An amount of polishing is set to 320 to 550 $\mu$m, for example, calculated in terms of film thickness. In the back grinding, a polishing disk (grindstone) 10 is employed.

Figure 4E:
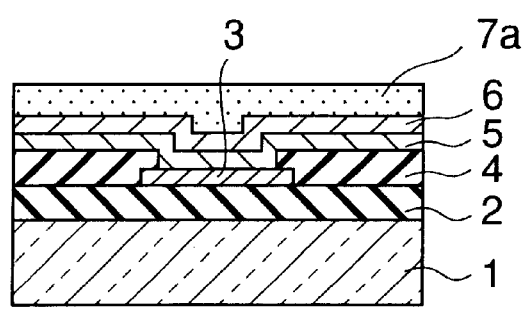

Then, as shown in FIG. 4E, the base material layer 7b of the protection film 7 is stripped off from the resist layer 7a to expose the resist layer 7a.

Figure 4F:
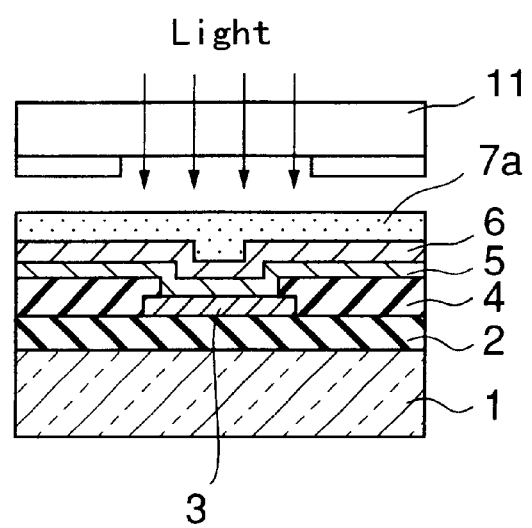

Then, as shown in FIG. 4F, while using a photomask 11, the light is irradiated onto the opening 4a of the cover film 4 and its peripheral area to expose the resist layer 7a. If the g-line or the i-line is used as the exposure light, luminous exposure is set to 50 to 500 mj/cm².

Figure 4G:
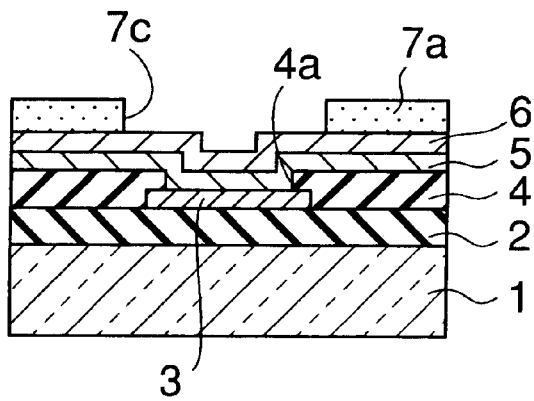

After this, as shown in FIG. 4G, a window 7c is formed over the opening 4a and its peripheral area by developing the resist layer 7a by using the developer. In this case, a solution that is formed of a $Na_2CO_3$ solution with a concentration of 0.1 to 3.0% or a TMAH solution with a concentration of 0.1 to 3.0% and is heated at 30 to 50° C., for example, is employed as the developer. Also, the spray developing method having an injection pressure of 1.5 to 2.5 kg/cm², for example, is employed as the developing system.

A planar shape of the bump forming window 7c is assumed as a regular polygonal shape or a substantial circular shape.

If the base material layer 7b of the protection film 7 has no exposure-light shielding function, a series of operations from the sticking of the protection film 7 to the development of the resist layer 7a must be executed in a room called a yellow room that is illuminated with only a non-photosensitive light or a darkroom.

Figure 4H:
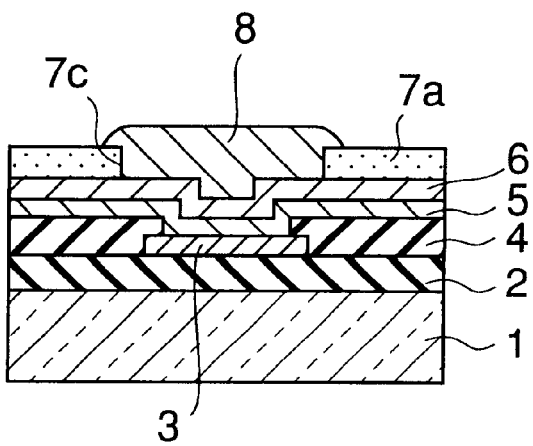

Then, as shown in FIG. 4H, a bump electrode (projection electrode) 8 made of lead-tin (PbSn) is formed on the second metal film 6 exposed from the window 7c. The bump electrode 8 can be formed by the electrolytic plating method that uses the first metal film 5 and the second metal film 6 as electrodes, for example.

Figure 4I:
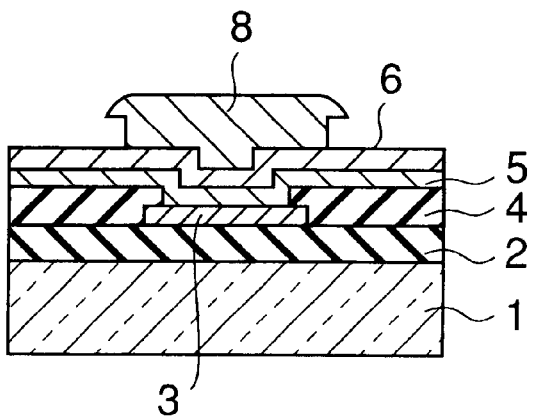

Then, as shown in FIG. 4I, the resist layer 7a is removed from a surface of the second metal film 6 by immersing in a removing solution. In this case, a solution that is formed of the TMAH solution with a concentration of 20%, a monoethanolamine solution with a concentration of 20%, or the $Na_2CO_3$ solution with a concentration of 5% and is heated at 50 to 60° C., for example, is employed as such removing solution.

Figure 4J:
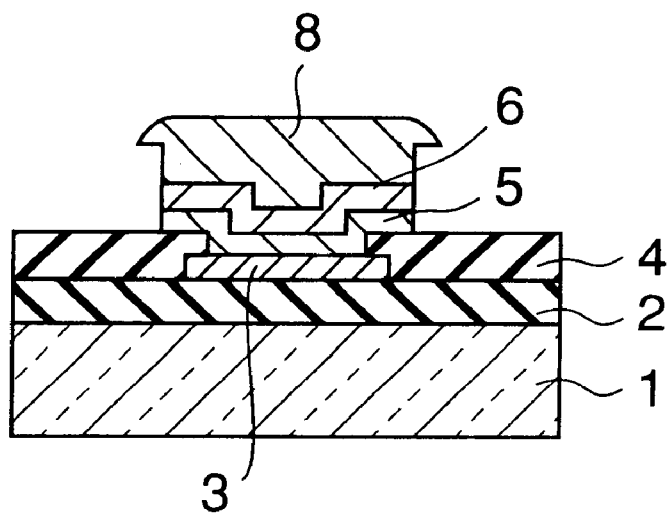

Then, as shown in FIG. 4J, the first and second metal films 5, 6 are etched by using the bump electrode 8 as a mask to be left only under the bump electrode 8.

Figure 4K:
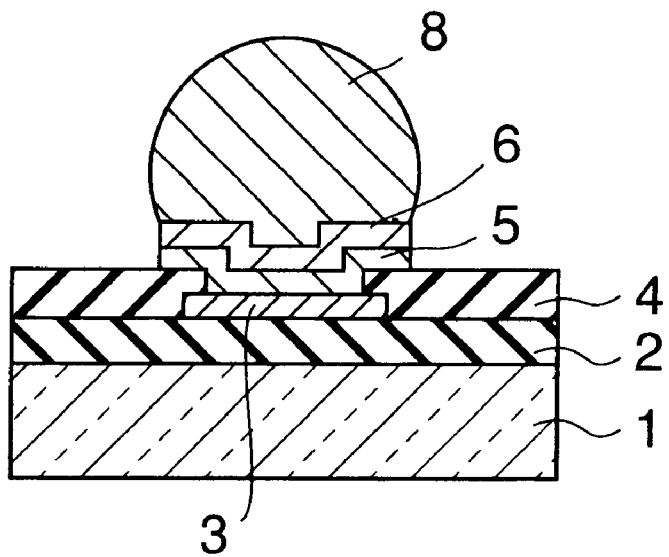

Then, as shown in FIG. 4K, the bump electrode 8 is heated at a temperature in excess of a melting point to reflow. Thus, the bump electrode 8 is shaped into a substantial spherical shape on the second metal film 6.

In the above steps, since the resist layer 7a is used as an adhesive layer of the masking tape, such resist layer 7a can be employed as the bump electrode forming mask as it is after the silicon substrate 1 has been ground/polished. Therefore, the steps from the polishing to the bump electrode formation can be simplified and thus the throughput can be improved. In addition, since the resist layer 7a can be removed perfectly from the surface of the silicon substrate 1 by the removing solution, generation of residue of the adhesive (paste) on the substrate, which is generated in the masking tape in the prior art, can be overcome.

Further, it is possible to re-use the base material layer 7b constituting the masking tape 7 if the resist is coated on the base material layer 7b.

The constituent material of the above bump electrode 8 is not limited to PbSn. Nickel formed by the electrolytic plating method or the electroless plating method, gold, or nickel/gold double-layered film, SnAg alloy, SnSb alloy, or conductive material having a melting point of less than 400° C. may be employed. In this case, a sectional shape of the bump electrode 8 becomes a circular cylinder shape and a mushroom shape. Furthermore, solder containing Pb, Sn as principal components may be formed on such metal film by the electrolytic plating method, the imprint method, the print method, etc. and then the solder may be formed into the substantial spherical shape by heating.

If the nickel is formed by the electroless plating method, an oxidation preventing film consisting of gold, palladium, platinum, etc. may be formed additionally on the nickel by the electroless plating method and then the resist layer may be removed.

Moreover, if a shape of the window 7c formed in the above resist layer 7a is shaped into the wiring shape, the wiring may be formed in place of the bump electrodes.

Second Embodiment

In the steps described in the first embodiment, formation of the first metal film 5 and the second metal film 6 may be omitted. Steps taken in such case will be explained hereinbelow.

Figure 7A:
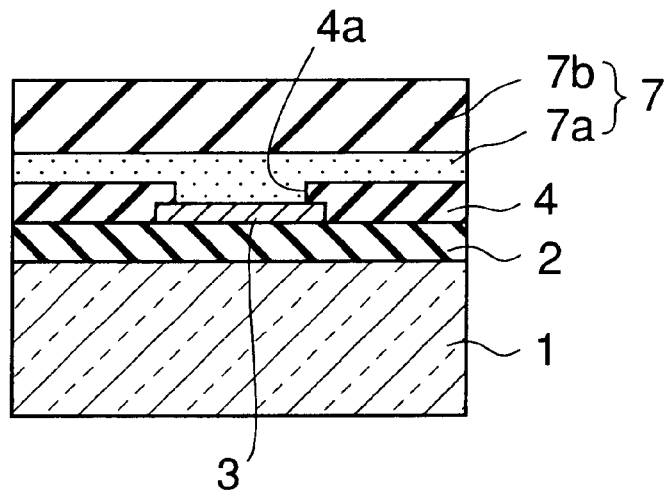
FIGS. 7A to 7F are sectional views showing grinding/polishing steps of a semiconductor substrate according to a second embodiment of the present invention.

First, as shown in FIG. 7A, after the opening 4a to expose the electrode pad 3 is formed in the cover film 4, the masking tape 7 is stuck onto the cover film 4 and the electrode pad 3.

Figure 7B:
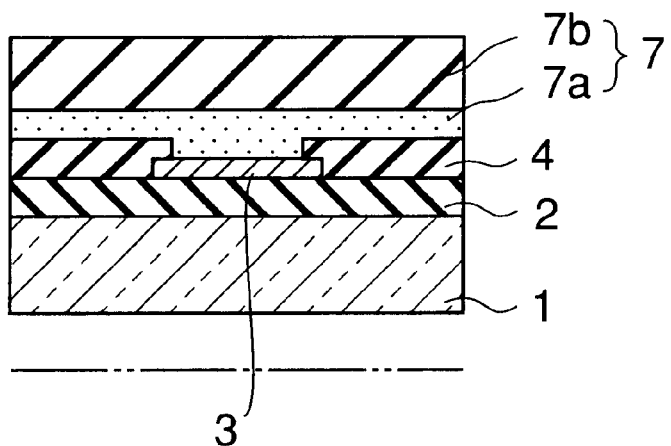
Figure 7C:
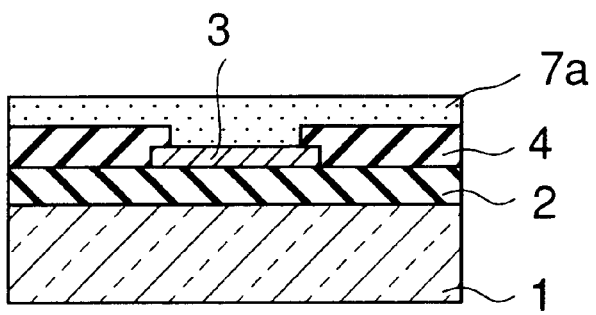
Figure 7D:
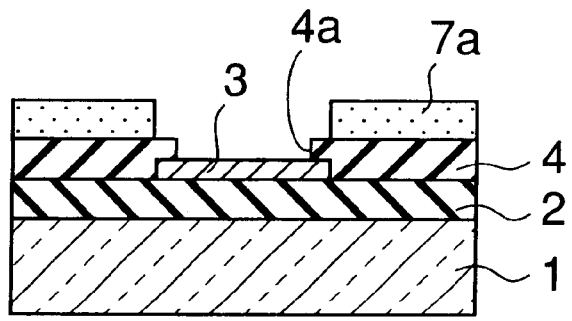

Then, as shown in FIG. 7B, the back surface of the silicon substrate 1 is ground/polished. Then, as shown in FIG. 7C, the base material layer 7b constituting the masking tape 7 is peeled off from the resist layer 7a. Then, as shown in FIG. 7D, the window 7c to expose the opening 4a is formed by exposing/developing the resist layer 7a.

Figure 7E:
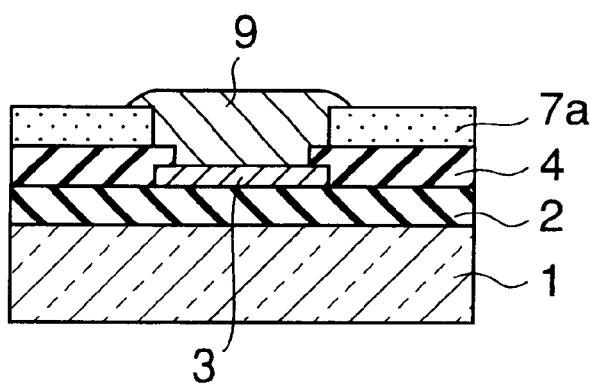
Figure 7F:
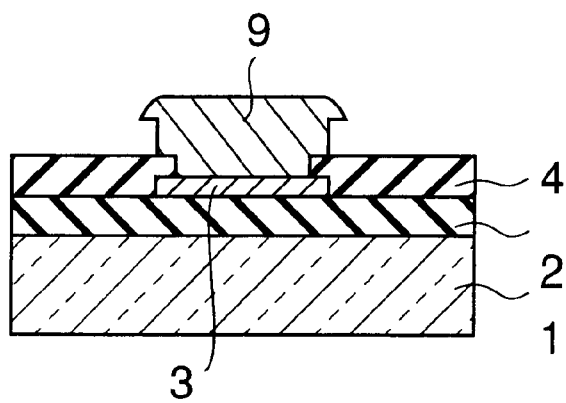

Then, as shown in FIG. 7E, nickel and gold that are used as a bump electrode 9 are formed directly on the electrode pad 3 via the window 7c and the opening 4a. Then, as shown in FIG. 7F, the resist layer 7a is peeled off.

In the above steps, since the resist layer 7a is also used as the adhesive layer of the masking tape 7, such resist layer 7a can be employed as a mask for subsequent steps and thus the throughput can be improved.

In the second embodiment, if the shape of the window 7c formed in the above resist layer 7a is shaped into the wiring shape, the wiring may also be formed in place of the bump electrodes.

Third Embodiment

In the first embodiment, the resist constituting the masking tape is employed to form the bump electrode. But such resist may be used to form pad rearrangement.

Figure 8:
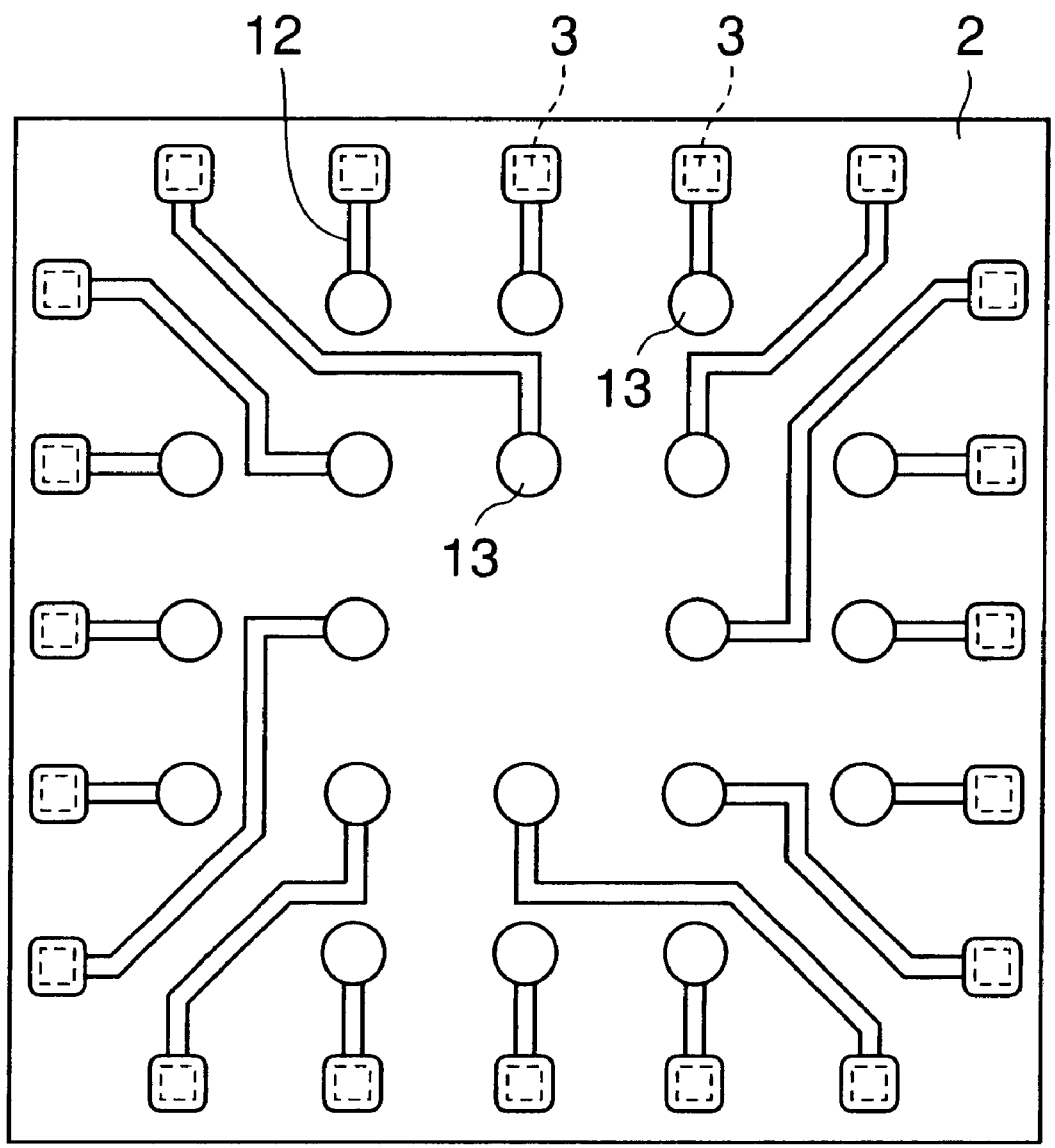
FIG. 8 is a top view showing a semiconductor substrate according to a third embodiment of the present invention.

Such pad rearrangement is to form the leading wirings that extend from the electrode pads 3 to the outside, as shown in FIG. 8. This is because such pad rearrangement is required to assure forming spaces of pad electrodes 13 that are connected electrically to the miniaturized electrode pads 3. The pad rearrangement in the third embodiment is executed as mentioned in the following.

Figure 9A:
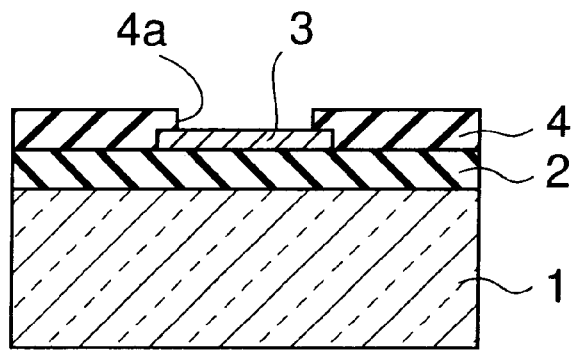
FIGS. 9A. to 9G are sectional views showing grinding/polishing steps of a semiconductor substrate according to the third embodiment of the present invention.

First, as shown in FIG. 9A, the insulating film 2 is formed on the silicon substrate 1 on which the semiconductor elements are formed, and then the electrode pad 3 is formed.

Then, the insulating cover film 4 is formed on the insulating film 2 and the electrode pad 3. Then, the opening 4a to expose the electrode pad 3 is formed by patterning the cover film 4 by virtue of the photolithography method.

Figure 9B:
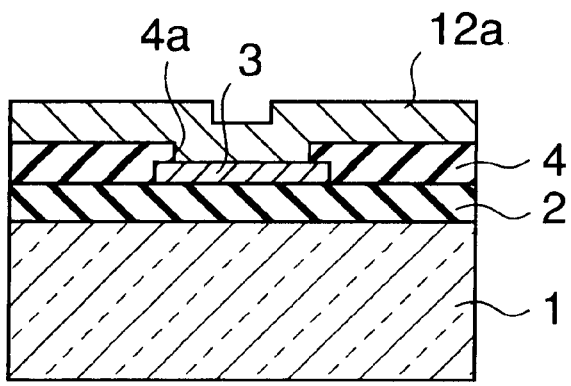

Then, as shown in FIG. 9B, a metal film 12a of 500 nm thickness is formed on the cover film 4 and in the opening 4a. As the metal film 12a, for example, there are a triple-layered film that consists of titanium (Ti), nickel (Ni), and gold (Au) formed in sequence, and a double-layered film that consists of titanium (Ti) and copper (Cu) formed in sequence.

Figure 9C:
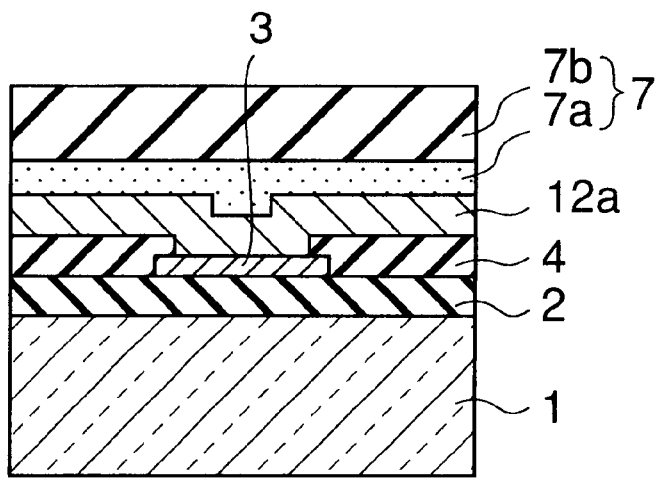

Then, as shown in FIG. 9C, the protection film 7 that has the same structure as the first embodiment is stuck on the metal film 12a by the pressure bonding.

Figure 9D:
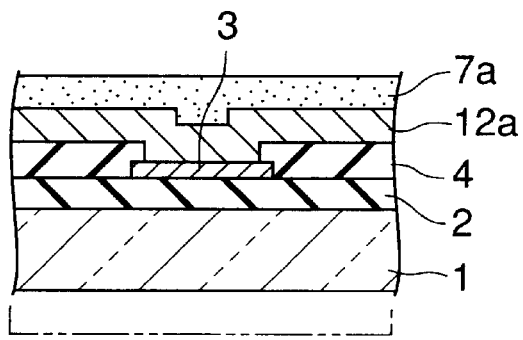

Then, the back surface of the silicon substrate 1 is ground/polished by the back grind method. Then, as shown in FIG. 9D, the resist layer 7a is exposed by peeling off the base material layer 7b of the protection film 7 from the resist layer 7a.

Figure 9E:
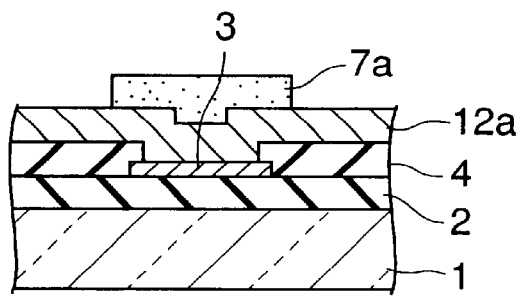

Then, as shown in FIG. 9E, the resist is shaped into the leading wiring shape extending from the opening 4a of the cover film 4 toward the outside by exposing/developing the resist layer 7a.

Figure 9F:
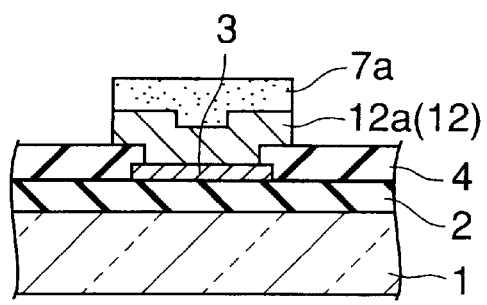

Then, as shown in FIG. 9F, the metal film 12a is patterned by etching portions of the metal film 12a, which are not covered with the resist layer 7a. Such patterned metal film 12a is used as the leading wiring 12.

Figure 9G:
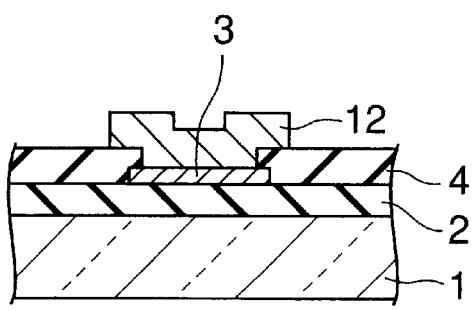

Then, as shown in FIG. 9G, the resist layer 7a is removed by the solvent, and then the pad electrode 13 is formed on the leading wiring 12. The pad electrode 13 can be formed by the electrolytic plating method or the electroless plating method using the resist pattern (not shown).

In the above steps, since the resist layer 7a is used as the adhesive layer of the masking tape 7, such resist layer 7a can be employed as the leading wiring forming mask as it is after the surface of the silicon substrate 1, that is not covered with the masking tape 7, has been ground/polished. Therefore, the steps from the polishing to the leading wiring formation can be simplified and thus the throughput can be improved.

In addition, since the resist layer 7a can be removed perfectly from the surface of the silicon substrate 1 by the removing solution, no resist layer remains on the silicon substrate 1.

The base material layer 7b constituting the masking tape 7 may be re-used.

Fourth Embodiment

FIGS. 10A to 10F are sectional views showing substrate polishing steps in the semiconductor device manufacture according to a fourth embodiment of the present invention.

Figure 10A:
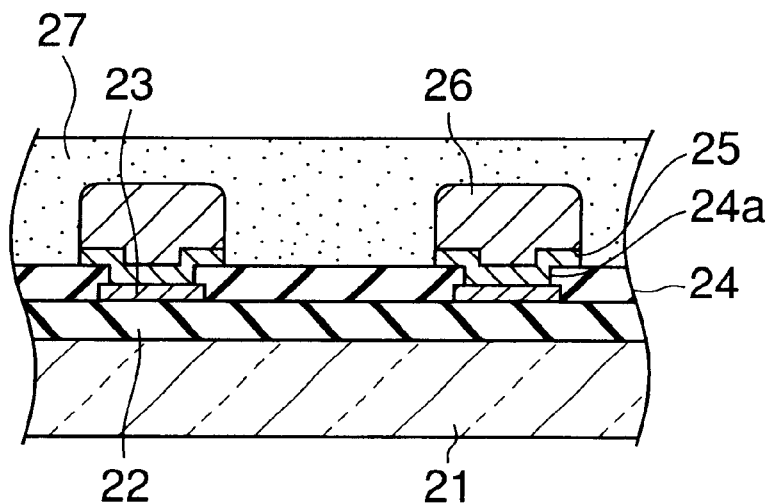
FIGS. 10A to 10F are sectional views showing grinding/polishing steps of a semiconductor substrate according to a fourth embodiment of the present invention.

First, steps performed up to the structure as shown in FIG. 10A will be explained hereunder.

In FIG. 10A, semiconductor elements (not shown) such as transistors are formed on a silicon (semiconductor) substrate 21, and then an insulating film 22 for covering the semiconductor elements is formed on one surface of the semiconductor substrate 21.

A plurality of electrode pads 23 are formed on the insulating film 22. Also, a cover film 24 made of silicon oxide, or the like is formed on the electrode pads 23 and the insulating film 22 such that the electrode pads 23 are exposed from openings 24a formed in the cover film 24.

A double-layered metal film 25 consisting of titanium (Ti) and nickel (Ni) is formed on the electrode pad 23. A bump electrode (projection electrode) 26 made of solder, that contains Pb, Sn as principal components, is formed on the opening 24a and the metal film 25 to have an almost circular cylindrical shape. The bump electrode 26 is formed by the electrolytic plating method, the electroless plating method, the imprint method, the print method, or the like. According to the electrolytic plating method, after a resist pattern is formed on the metal film 25, the bump electrode 26 is formed only over the opening 24a while using the metal film 25 as the electrode. In this case, the metal film 25 is patterned by using the bump electrodes 26 having the almost circular cylindrical shape as a mask.

Then, a flux 27 is supplied onto the bump electrodes 26 and the cover film 24.

Figure 10B:
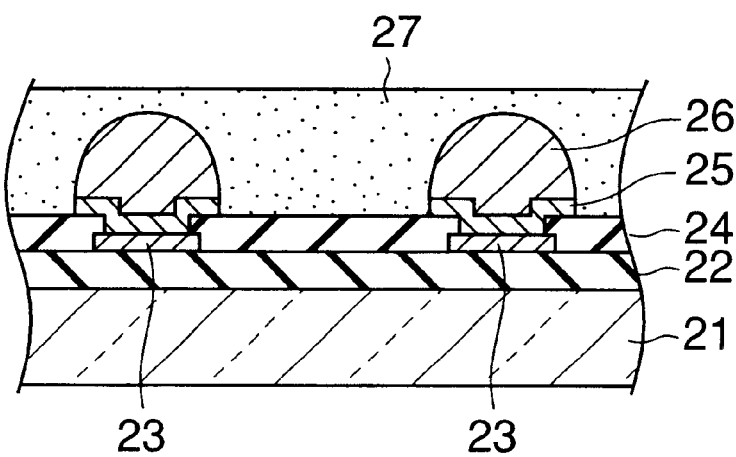

Then, as shown in FIG. 10B, if the bump electrodes 26 are heated to reflow, surfaces of the bump electrodes 26 are purified by the flux and the bump electrodes 26 are shaped into an almost spherical shape.

A melting point of the bump electrodes 26 is about 320° C. if the bump electrodes 26 are formed by solder in which Pb and Sn are mixed by the ratio of 95 to 5, and is about 183° C. if the bump electrodes 26 are formed by solder in which Pb and Sn are mixed by the ratio of 64 to 36. Therefore, the heating temperature of the bump electrodes 26 is set to more than the melting point of the solder. The flux 27 is solidified by such heating.

Figure 10C:
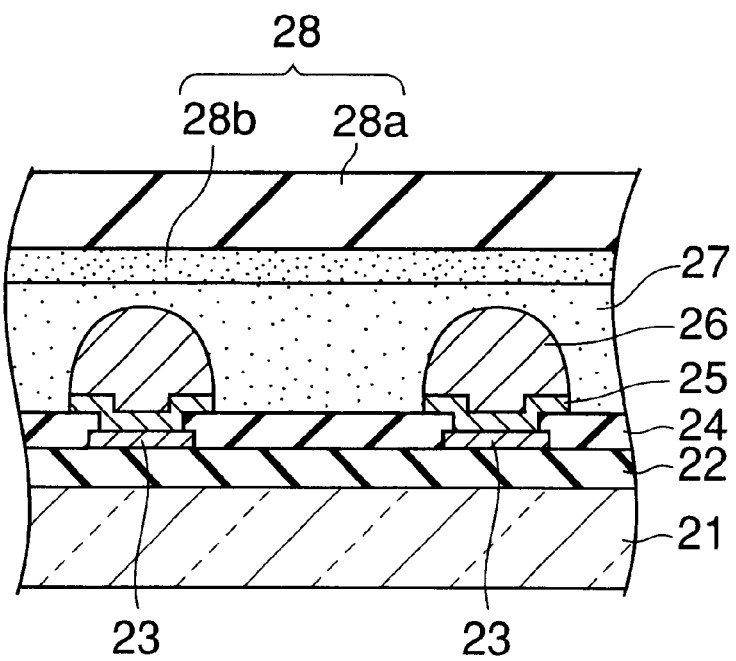

Then, as shown in FIG. 10C, a masking tape 28 is pasted on the flux 27. The masking tape 28 has a structure that is constructed by coating an adhesive layer 28b on a base material layer 28a, which is different from the masking tape employed in the first to third embodiments.

Figure 10D:
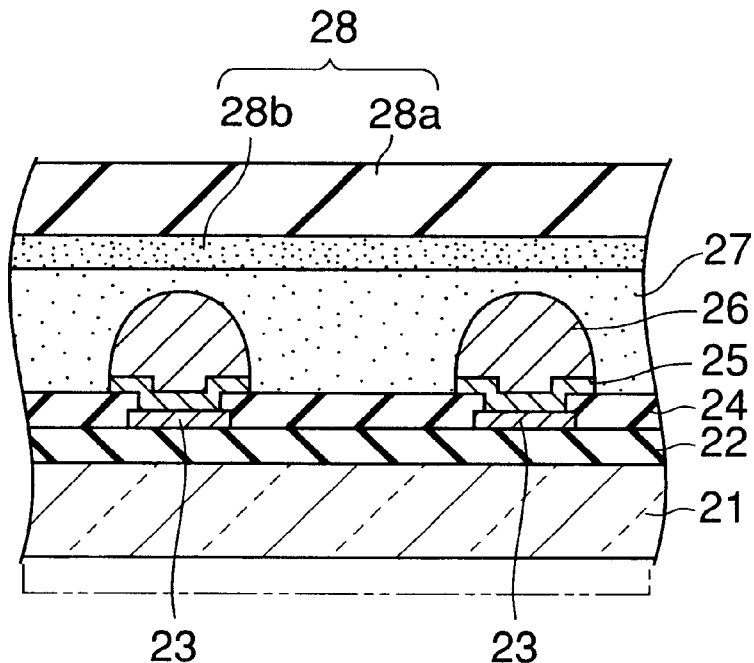

Then, as shown in FIG. 10D, the silicon substrate 21 is thinned up to 350 $\mu$m, for example, by grinding/polishing a back surface of the silicon substrate 21, i.e., a surface opposite to the surface on which the masking tape 28 is pasted, by the polishing disk (grindstone). The grinding/polishing state of the substrate is given as shown in FIG. 6.

Figure 10E:
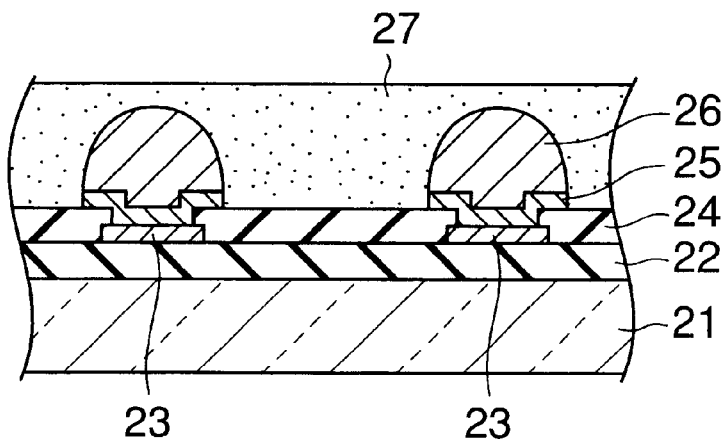
Figure 10F:
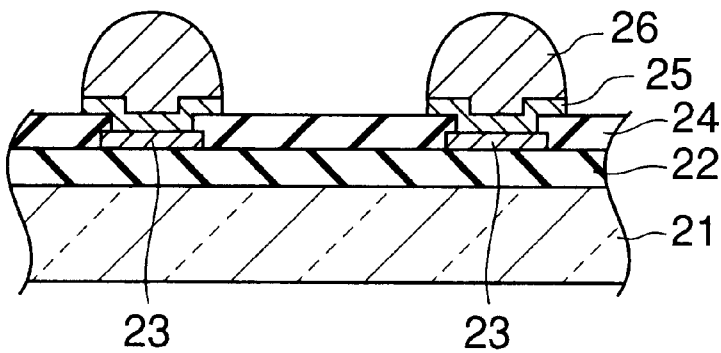

Then, as shown in FIG. 10E, the masking tape 28 is peeled off from the silicon substrate 21. Then, as shown in FIG. 10F, the flux 27 formed on the cover film 24 and the bump electrodes 26 is removed by the flux cleaning agent.

With the above, steps from the shaping of the bump electrodes 26 to the polishing of the substrate are completed.

As described above, in the fourth embodiment, in polishing the back surface of the silicon substrate 21, the masking tape 28 is stuck on the flux 27 in the situation that the flux 27 is still left between a plurality of bump electrodes 26.

Accordingly, the bump electrodes 26 are covered with the flux 27 and the flux 27 is filled into spaces between the bump electrodes 26. Therefore, the stress applied to the silicon substrate 21 upon polishing the substrate is never concentrated on the bump electrodes 26, and also the flux 27 can absorb gaps between the bump electrodes 26.

As a result, the probability of crack of the silicon substrate 21 becomes extremely low, so that the grinding/polishing of the silicon substrate 21 can be carried out satisfactorily.

In addition, since the masking tape 28 is stuck on the flux 27, the adhesive layer 28b is never left on the bump electrodes 26 and the cover film 24 in stripping off the masking tape 28. Therefore, the operation of removing the adhesive layer 28b from the substrate, which is required in the prior art, is not needed.

Fifth Embodiment

In the fourth embodiment, the masking tape 28 is pasted on the flux. Another layer may be filled into the spaces between the bump electrodes after the flux is removed, and such example will be explained in the following.

Figure 11A:
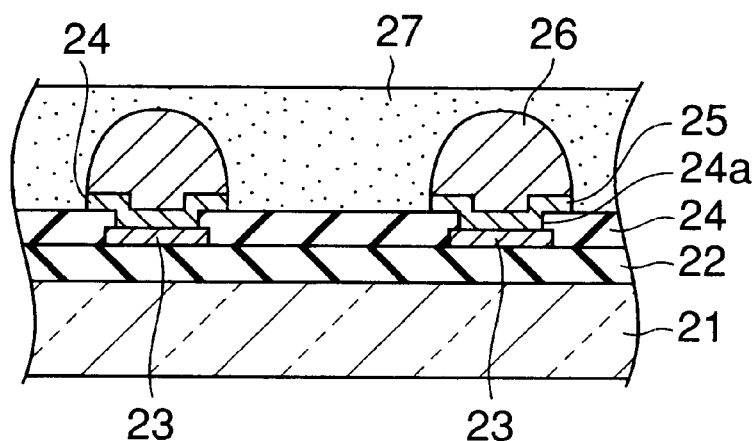
FIGS. 11A to 11F are sectional views showing grinding/polishing steps of a semiconductor substrate according to a fifth embodiment of the present invention.

First, as shown in FIG. 11A, the bump electrodes 26 are deformed into an almost spherical shape by heating them. In this case, like the fourth embodiment, the bump electrodes 26 are covered with the flux 27.

Figure 11B:
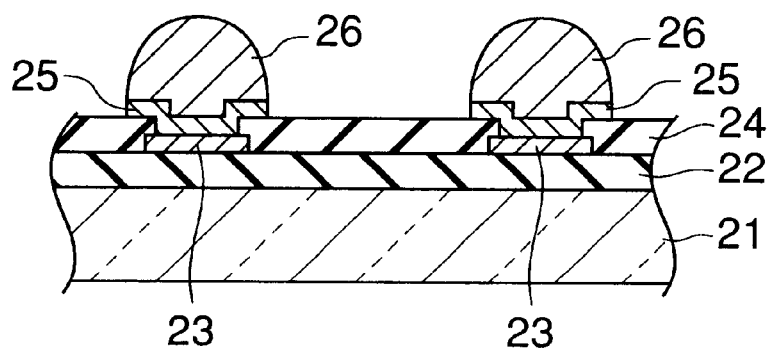

Then, as shown in FIG. 11B, the flux 27 is removed from surfaces of the cover film 24 and the bump electrodes 26.

Figure 11C:
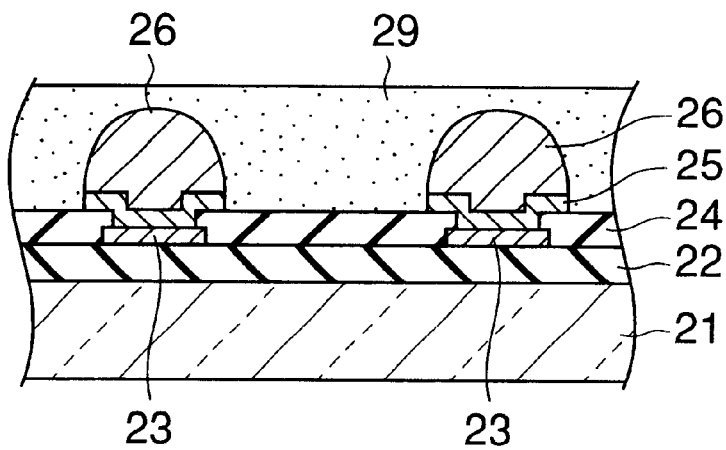

In the prior art, subsequently the masking tape is pasted on the cover film 24. In the fifth embodiment, as shown in FIG. 11C, resist 29 which has high viscosity of more than 500 CP is coated on the cover film 24 and the solder bumps 26. It is preferable that the resist 29 should be coated to have a thickness whose surface is located higher than a height of the bump electrode 26.

Figure 11D:
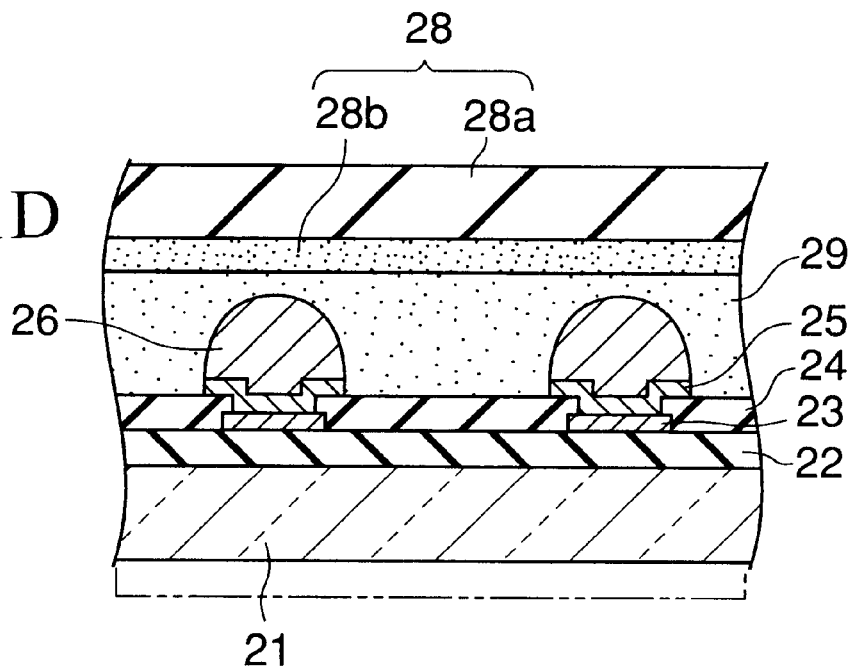

Then, as shown in FIG. 11D, the masking tape 28 is pasted on the resist 29. In this case, the resist 29 may baked prior to the pasting of the masking tape 28.

Then, a thickness of the silicon substrate 21 is reduced to less than 350 μm by grinding/polishing the back surface of the silicon substrate 21.

Figure 11E:
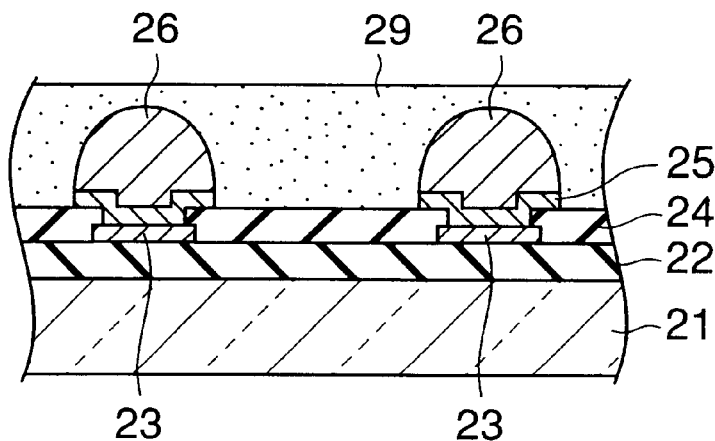
Figure 11F:
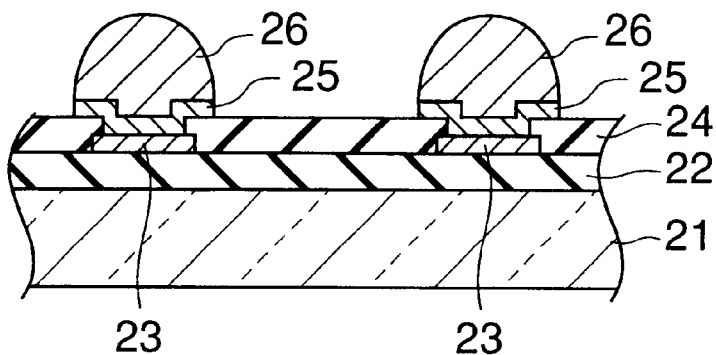

Then, as shown in FIG. 11E, the masking tape 28 is stripped off from the resist 29. Then, as shown in FIG. 11F, the resist 29 is removed by the solvent.

With the above, steps from the shaping of the bump electrodes 26 to the polishing of the substrate are completed.

As described above, in the fifth embodiment, since the bump electrodes 26 and the cover film 24 are covered with the resist 29 prior to the pasting of the masking tape 28, the stress applied to the silicon substrate 21 upon polishing the substrate is never concentrated on the bump electrodes 26 and thus the probability of crack of the silicon substrate 21 becomes extremely low, like the fourth embodiment.

In addition, the viscosity of the resist 29 employed in place of the flux can be increased and the resist 29 can be cured by the baking. Therefore, the pressure applied to the bump electrodes 26 can be scattered and thus the probability of substrate crack can be reduced.

Here, the bump electrodes formed of material except the solder explained in the first embodiment may be employed instead of the above bump electrodes.

Sixth Embodiment

In a sixth embodiment, grinding/polishing of the back surface of the silicon substrate by using a masking tape 30 having a new structure will be explained hereunder.

Figure 12:
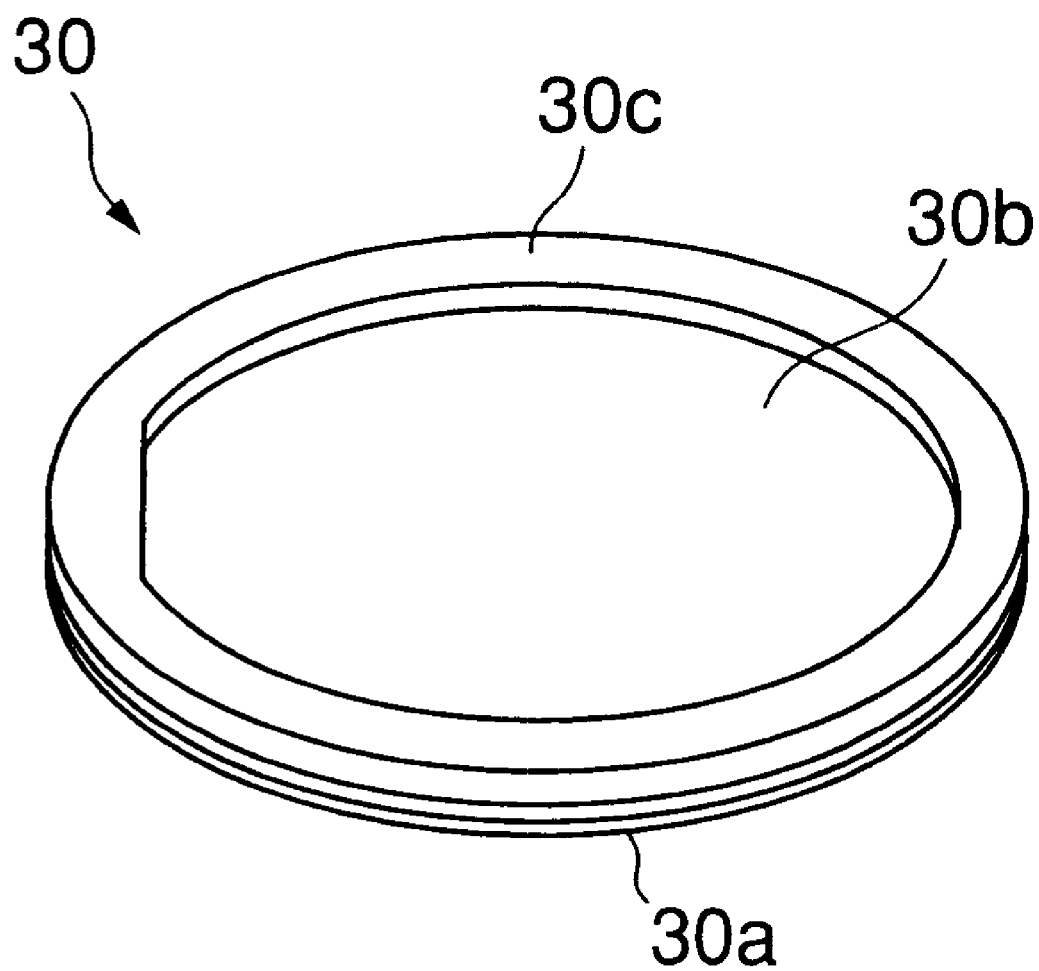
FIG. 12 is a perspective view showing a masking tape employed in sixth and seventh embodiments of the present invention.

As shown in FIG. 12, in the masking tape 30, a first adhesive layer 30b which has a thin thickness of 30 μm is coated on the overall surface of a base material layer 30a which is formed of ultraviolet transmissible material such as glass, and then a second ring adhesive layer 30c which is thicker than the bump electrodes is coated on portions opposing to edge portions of the silicon substrate. As the first and second adhesive layers 30b and 30c, the ultraviolet (UV) cured tape, e.g., a product SB-TY-B manufactured by The Furukawa Electric Co., Ltd., for example, may be employed. Also, if the height of the bump electrodes is 70 μm to 200 μm, a thickness of the second adhesive layer 30b is set to 200 μm, for example.

Figure 13A:
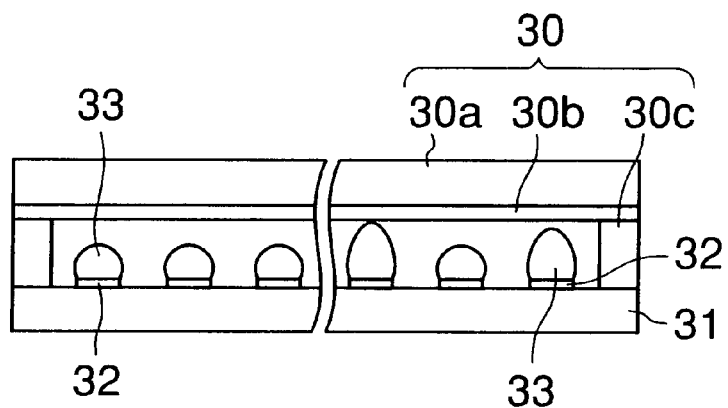
FIGS. 13A to 13D are sectional views showing grinding/polishing steps of a semiconductor substrate according to the sixth embodiment of the present invention.

After such masking tape 30 is prepared, as shown in FIG. 13A, the second adhesive layer 30c is stuck onto a peripheral area of a silicon substrate 31.

A plurality of pads 32 are formed on the silicon substrate 31 via an insulating film (not shown), and then bump electrodes 33 made of solder, etc. are formed on these pads 32.

Figure 13B:
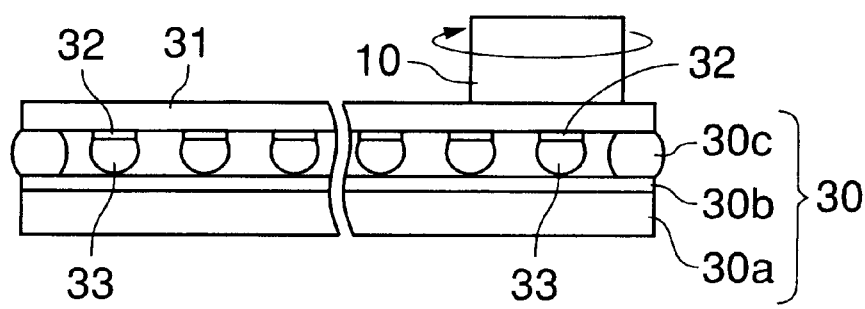

Then, as shown in FIG. 13B, a surface of the silicon substrate 31, which is not covered with the masking tape 30, is ground/polished by a grindstone 10 to reduce a thickness to less than 350 μm, for example. Since a weight of 10 kg, for example, is applied to the overall silicon substrate 31 having a diameter 200 mm by the grindstone 10 in grinding/polishing, the bump electrodes 33 are pushed against the silicon substrate 31 by such pushing force.

Accordingly, if a plurality of bump electrodes 33 are not uniform in height, the higher bump electrodes 33 are crushed by the pushing force. Thus, the heights of plural bump electrodes 33 are substantially uniformized. In this case, since the base material layer 30a of the masking tape 30 is hard, the force is also applied to the peripheral area of the silicon substrate 31 on which the bump electrodes 33 are not formed and as a result the pushing force applied to the bump electrodes 33 can be reduced rather than the prior art.

Under the condition that the device forming area is covered with the masking tape 30, the polishing of the silicon substrate 31 is finished.

Figure 13C:
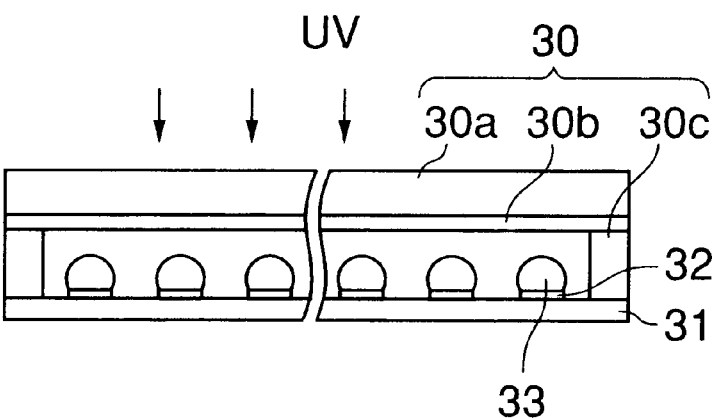
Figure 13D:
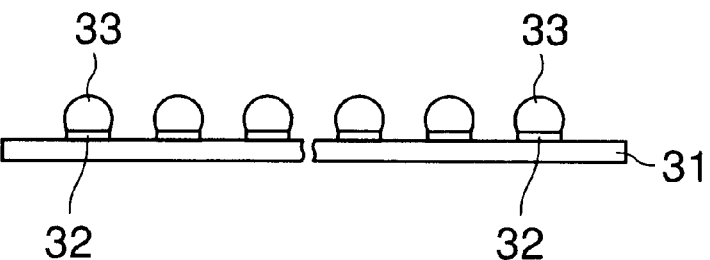

Then, as shown in FIG. 13C, the first and second adhesive layers 30b, 30c are cured by irradiating the UV light onto them through the base material layer 30a. As a result, as shown in FIG. 13D, these adhesive layers 30b, 30c can be stripped readily off from the silicon substrate 31.

In the above example, the base material layer 30a of the masking tape 30 is constructed by the material that can transmit the ultraviolet rays (UV) and the adhesive layers 30b, 30c are constructed by the UV cured material. But employment of such structure is not always needed. For example, the base material layer 30a of the masking tape 30 may be formed of hard resin such as PET, PP, etc. that has a Rockwell hardness M88 or more, and the adhesive layers 30b, 30c may be formed of acrylic material. If such material is employed, the step of irradiating the ultraviolet rays shown in FIG. 13C can be omitted.

In this case, the first adhesive layer 30b of the masking tape 30 may be omitted.

Seventh Embodiment

FIGS. 14A to 14E are sectional views showing the steps of polishing the semiconductor substrate and forming the bump electrode according to the seventh embodiment of the present invention.

Figure 14A:
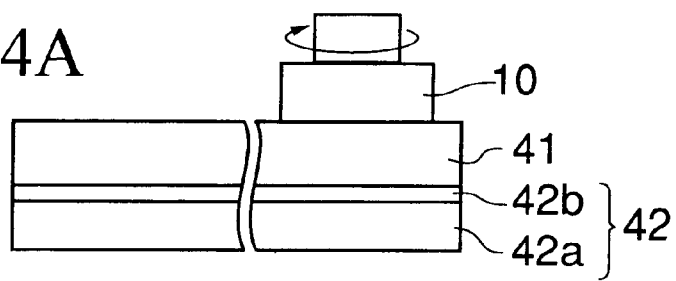
FIGS. 14A to 14E are sectional views showing grinding/polishing steps of a semiconductor substrate according to the seventh embodiment of the present invention.

First, as shown in FIG. 14A, a surface, on which semiconductor elements are formed, of a silicon substrate 41, on which the bump electrodes are not formed, is covered with a masking tape 42. This masking tape 42 has a base material layer 42a and an adhesive layer 42b. The same structure as the masking tape in the first embodiment may be employed, or the same structure as that employed in the prior art may be employed.

Then, a surface of the silicon substrate 41 opposite to the masking tape 42 is ground/polished by the grindstone 10 to reduce a thickness of the silicon substrate 41.

Figure 14B:
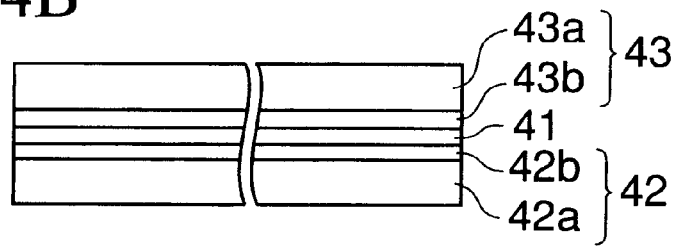

Then, as shown in FIG. 14B, a supporting tape (wafer support tape) 43 is pasted on a polished surface of the silicon substrate 41. The supporting tape 43 has a base material layer 43b on which an adhesive layer 43a made of ultraviolet curing material is formed.

Figure 14C:
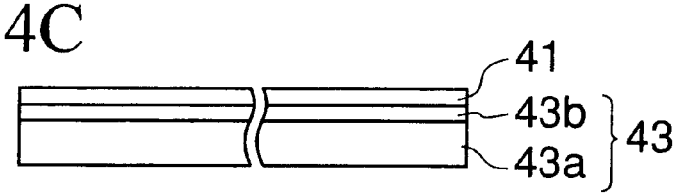

Then, as shown in FIG. 14C, the masking tape 42 is peeled off.

Figure 14D:
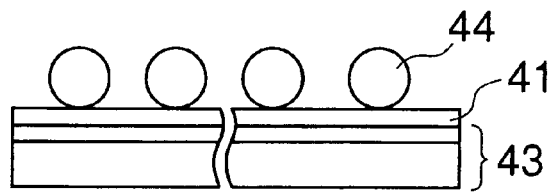

Then, as shown in FIG. 14D, bump electrodes (projection electrodes) 44 are formed on a device forming surface of the silicon substrate 41 by any one of methods set forth in the prior art and the first to third embodiments.

Figure 14E:
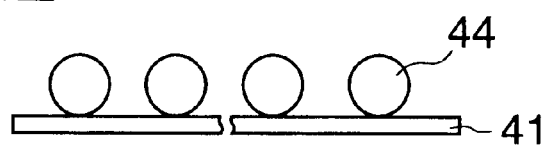

Then, the adhesive layer 43a is cured by irradiating the ultraviolet rays onto the supporting tape 43. Then, as shown in FIG. 14E, the supporting tape 43 is stripped off from the silicon substrate 41.

According to the above steps, the silicon substrate 41 can go through various processes in the situation that the supporting tape 43 is pasted on the polished surface of the silicon substrate 41. Therefore, the silicon substrate 41 can be reinforced and thus the silicon substrate 41 becomes hard to crack or break off.

In this case, the polishing of the silicon substrate in the above embodiments may employ the back grind method, the chemical etching method, etc.

As described above, according to the semiconductor device of the present invention, one surface of the semiconductor substrate is covered with the masking tape which consists of the base material layer and the resist layer coated on this base material layer. Therefore, if only the base material layer of the masking tape is stripped off after the polishing of the other surface (back surface) of the semiconductor substrate has been finished and then the remaining resist layer is used in patterning as it is, the step of coating the resist onto the semiconductor substrate can be omitted.

Also, according to the semiconductor device manufacturing method of the present invention, one surface of the semiconductor substrate is covered with the masking tape which consists of the base material layer and the resist layer coated on this base material layer, then the other surface (back surface) of the semiconductor substrate is polished, then the base material layer of the masking tape is stripped off from the masking tape, and then the resist pattern used for the bump electrode formation and the wiring formation is formed by exposing/developing the resist layer. Therefore, time and labor for coating the resist can be omitted and thus the throughput can be improved. Also, since it is ready to remove the resist layer substantially perfectly by the solvent, the contamination of the semiconductor substrate can be prevented. In addition, since the adhesive does not remain on the peeled base material layer unlike the prior art, the base material layer can be re-used and thus an amount of waste product can be reduced.

Furthermore, according to another invention, prior to the polishing of the back surface of the semiconductor substrate, the flux or the resist is coated between the projection electrodes formed on the opposite side surface and then the masking tape is pasted thereon. Therefore, in polishing the semiconductor substrate, the pushing force of the masking tape is applied to not only the projection electrodes but also the flux or the resist to scatter, and thus the crack of the semiconductor substrate can be prevented.

Besides, according to still another invention, the other surface of the semiconductor substrate is polished in the situation that one surface of the semiconductor substrate is covered with the masking tape, then the masking tape is stripped off in the situation that the support tape is pasted on the other surface, and then the projection electrodes are formed on one surface. Therefore, since the semiconductor substrate is reinforced by the support tape, the crack of the substrate caused in forming the projection electrodes can be prevented.

What is claimed is:

1. A semiconductor device comprising:
   electrode pads formed on an insulating film on a semiconductor substrate;
   an insulating cover film formed on the insulating film to have openings that expose the electrode pads; and
   a masking tape having a base material layer and a resist layer coated on the base material layer, and to cover an upper surface of the cover film and inner surfaces of the openings in a situation that the resist layer is directed toward a semiconductor substrate side.

2. A semiconductor device according to claim 1, wherein a metal film is formed on the electrode pads and the insulating cover film and under the masking tape.

3. A semiconductor device according to claim 2, wherein the metal film has a multi-layered structure.

4. A semiconductor device according to claim 1, wherein the base material layer is formed of material that can prevent exposure of the resist layer.

5. A semiconductor device comprising:
   an insulating film;
   an electrode pad on the insulating film;
   a cover film on the insulating film; and
   a masking tape on the cover film having a first layer and a second layer on the first layer.

6. A semiconductor device according to claim 5, wherein the insulating film is formed on a semiconductor substrate and the cover film has openings that expose the electrode pad.

7. A semiconductor device according to claim 6, wherein the masking tape covers an upper surface of the cover film and inner surfaces of the openings.

8. A semiconductor device according to claim 5, wherein the first layer is a base material layer and the second layer is a resist layer.

* * * * *